United States Patent
Chan et al.

(10) Patent No.: US 9,773,894 B2
(45) Date of Patent: Sep. 26, 2017

(54) APPLICATION OF SUPER LATTICE FILMS ON INSULATOR TO LATERAL BIPOLAR TRANSISTORS

(71) Applicant: INTERNATIONAL BUSINESS MACHINES CORPORATION, Armonk, NY (US)

(72) Inventors: Kevin K. Chan, Staten Island, NY (US); Bahman Hekmatshoartabari, White Plains, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/206,725

(22) Filed: Jul. 11, 2016

(65) Prior Publication Data

US 2016/0322481 A1    Nov. 3, 2016

Related U.S. Application Data (63) Continuation of application No. 14/208,704, filed on Mar. 13, 2014, now Pat. No. 9,425,260.

(51) Int. Cl.

| | |
|---|---|
| *H01L 29/00* | (2006.01) |
| *H01L 29/735* | (2006.01) |
| *H01L 29/15* | (2006.01) |
| *H01L 29/737* | (2006.01) |
| *H01L 29/66* | (2006.01) |

(Continued)

(52) U.S. Cl.
CPC ........ *H01L 29/735* (2013.01); *H01L 21/0262* (2013.01); *H01L 21/02532* (2013.01); *H01L 29/0649* (2013.01); *H01L 29/0808* (2013.01); *H01L 29/0821* (2013.01); *H01L 29/1008* (2013.01); *H01L 29/155* (2013.01); *H01L 29/161* (2013.01); *H01L 29/165* (2013.01); *H01L 29/205* (2013.01);

(Continued)

(58) Field of Classification Search
CPC ............... H01L 29/735; H01L 29/7378; H01L 29/1004; H01L 29/1008
USPC .......................... 257/557, 558, 592, 615, 616
See application file for complete search history.

(56) References Cited

U.S. PATENT DOCUMENTS

| | | | |
|---|---|---|---|
| 4,593,305 A | 6/1986 | Kurata et al. | |
| 6,057,567 A | 5/2000 | Bayraktaroglu | |

(Continued)

FOREIGN PATENT DOCUMENTS

| | | |
|---|---|---|
| CN | 103035687 A | 4/2013 |
| JP | 3327478 B2 | 9/2002 |
| JP | 2008112939 A | 5/2008 |

*Primary Examiner* — Matthew E Warren
(74) *Attorney, Agent, or Firm* — Tutunjian & Bitetto, P.C.; Louis J. Percello (57) ABSTRACT

A lateral bipolar junction transistor including a base region on a dielectric substrate layer. The base region includes a layered stack of alternating material layers of a first lattice dimension semiconductor material and a second lattice dimension semiconductor material. The first lattice dimension semiconductor material is different from the second lattice dimension semiconductor material to provide a strained base region. A collector region is present on the dielectric substrate layer in contact with a first side of the base region. An emitter region is present on the dielectric substrate in contact with a second side of the base region that is opposite the first side of the base region.

18 Claims, 4 Drawing Sheets

(51) Int. Cl.
  H01L 29/165    (2006.01)
  H01L 29/205    (2006.01)
  H01L 21/02     (2006.01)
  H01L 29/10     (2006.01)
  H01L 29/161    (2006.01)
  H01L 29/06     (2006.01)
  H01L 29/08     (2006.01)

(52) U.S. Cl.
  CPC .... *H01L 29/6625* (2013.01); *H01L 29/66242* (2013.01); *H01L 29/737* (2013.01); *H01L 29/7378* (2013.01)

(56)  References Cited

U.S. PATENT DOCUMENTS

| | | |
|---|---|---|
| 6,492,664 B2 | 12/2002 | Tanomura |
| 7,776,704 B2 | 8/2010 | Dunn et al. |
| 7,888,745 B2 | 2/2011 | Khater et al. |
| 9,425,260 B2 * | 8/2016 | Chan .................... H01L 29/155 |
| 2002/0042178 A1 | 4/2002 | Dutartre et al. |

* cited by examiner

APPLICATION OF SUPER LATTICE FILMS ON INSULATOR TO LATERAL BIPOLAR TRANSISTORS

BACKGROUND

Technical Field

The present disclosure relates to semiconductor devices. The present disclosure further relates to bipolar junction transistors.

Description of the Related Art

Lateral bipolar junction transistors can be formed by depositing the emitter, base and/or collector contacts on an insulating substrate. Strained silicon germanium is one material for use in lateral bipolar junction transistors. Strained silicon germanium (SiGe) that is grown on a silicon layer is limited in thickness prior to the formation of a high concentration of defects. Typically, the higher the percentage of germanium (Ge) in the silicon germanium (SiGe), the thinner the SiGe film. In general, the relation between the SiGe film thickness and the percentage of Ge in the film is governed by the Matthews-Blakeslee limit.

SUMMARY

In one embodiment, a lateral bipolar junction transistor is provided that includes a base region on a dielectric substrate layer. The base region includes a layered stack of alternating material layers of a first lattice dimension semiconductor material and a second lattice dimension semiconductor material. The first lattice dimension semiconductor material is different from the second lattice dimension semiconductor material to provide a strained base region. A collector region is present on the dielectric substrate layer in contact with a first side of the base region. An emitter region is present on the dielectric substrate in contact with a second side of the base region that is opposite the first side of the base region.

In another embodiment, a lateral bipolar transistor is provided that includes a base region on a dielectric substrate layer. The base region includes a layered stack of alternating silicon and silicon germanium layers. Each layer in the layered stack has a thickness no greater than 40 nm, and a total thickness for the layered stack is greater than 100 nm. A collector region is present on the dielectric substrate layer in contact with a first side of the base region. An emitter region is present on the dielectric substrate in contact with a second side of the base region that is opposite the first side of the base region.

In another aspect, a method of forming a semiconductor device is provided that includes providing a seed layer of a first lattice dimension material that is present on a dielectric layer, and epitaxially forming a first layer of a second lattice dimension material on the seed layer. A second layer of the first lattice dimension material is then epitaxially formed on the first layer. Alternating epitaxial layer formation of the second lattice dimension material and the first lattice dimension material starting on an upper surface of the second layer then provide a super lattice structure having a thickness of at least 100 nm. The thickness of the super lattice structure is measured from a surface of the dielectric layer. An extrinsic semiconductor material is formed on a base region portion of the super lattice structure. An emitter region is formed on a first side of the base region. A collector region is formed on a second side of the base region that is opposite the first side of the base region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide lateral bipolar junction devices where the base region, i.e., intrinsic base region, of the device is a super lattice structure of alternating materials having different lattice dimensions to produce a strain. The term "bipolar junction transistor" denotes a type of transistor made of three regions of semiconductor materials each having an inherent electrical charge, i.e., conductivity, such as n-type or p-type conductivity. Each region has been treated, e.g., doped, so that the layer in the middle (called the base region) has a first conductivity type, while the layers around it (i.e., the emitter region and the collector region) have a second conductivity type opposite to the first conductivity type. A bipolar junction transistor with an n-type base is designated PNP, and one with a p-type base is designated NPN. When subjected to current flow, the base acts like a gate, enhancing or inhibiting the current flow from the emitter to the collector. In some embodiments, the bipolar junction transistor is lateral, i.e., has a lateral orientation. By having a "lateral orientation" it is meant that the emitter region, base region and collector region are present on a substrate and are orientated left to right, or right to left, as depicted in the supplied figures. A "super lattice structure" is a layered structure of at least two layers of differing material composition in a repeating sequence. For example, if the two layers of differing material composition included a silicon and silicon germanium, a super lattice structure may include a layer sequence of Si, SiGe, Si, SiGe, Si, SiGe, Si, SiGe, Si, SiGe, etc.

Figure 1:
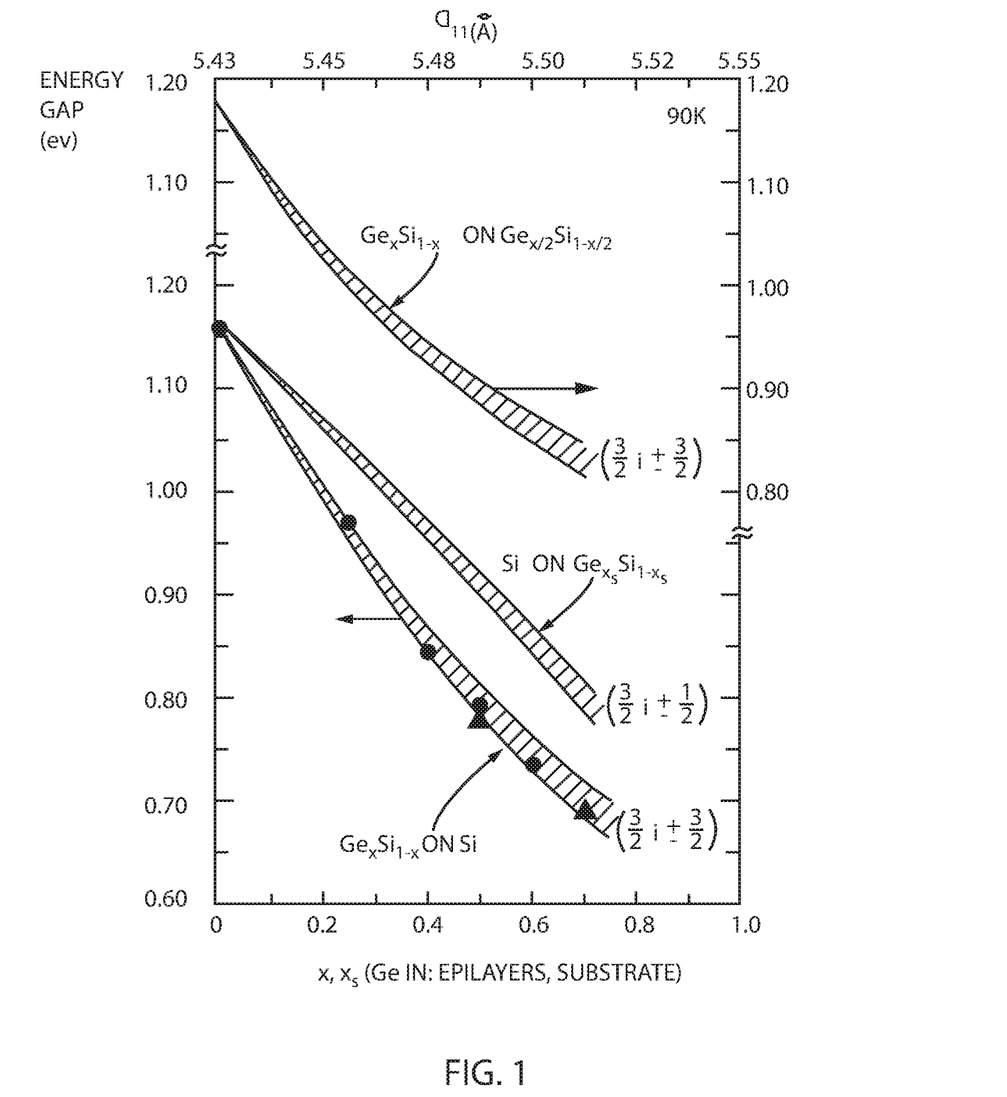
FIG. 1 is a plot depicting the relationship between the germanium content of a silicon and germanium layer and the band gap of the silicon and germanium containing layer.

Germanium containing materials, such as germanium (Ge) and silicon germanium (SiGe), are of particular interest to lateral bipolar junction transistors for applications employing a low voltage during operation, e.g., a voltage ranging from 0.4 V to 2 V. Germanium containing materials are suitable for low voltage applications, because germanium has an energy band gap, i.e., approximately 0.66 eV, that is less than the energy band gap of silicon, i.e., the energy band gap of silicon is on the order of 1.1 eV. The greater the germanium content in silicon germanium the lesser the band gap, as depicted in FIG. 1. Further, introducing a strain to silicon germanium further reduces the band gap. It has been determined that germanium containing materials, such as silicon germanium (SiGe), can only have a limited thickness before defect formation within the germanium containing layer reaches a level that is unacceptable for use in lateral bipolar junction transistors. For example, for a silicon germanium (SiGe) film with 25% of germanium (Ge), a thickness of only about 10 nm can be obtained without the defect density within the film reaching levels greater than $1 \times 10^6/cm^2$.

It has been determined that limiting the thickness of germanium containing layers within the base region of the lateral bipolar junction transistor has a negative impact on device performance. For example, the collector current is proportional to the film thickness, and the emitter-base bias voltage needed to achieve a certain level of collector current decreases with increase in average germanium percentage in the film. In some embodiments, the methods and structures that are disclosed herein, employ a super lattice structure to obtain thick Si/SiGe composite films, with thickness and germanium percentage that exceed the Matthews-Blakeslee limit. For example, the methods and structures disclosed herein may provide a super lattice structure having a thickness that is greater than 60 nm. In some embodiments, the super lattice structures are employed in bipolar lateral transistors. Some embodiments of the methods and structures disclosed herein, are now described in more detail with reference to FIGS. 2-11.

Figure 2:
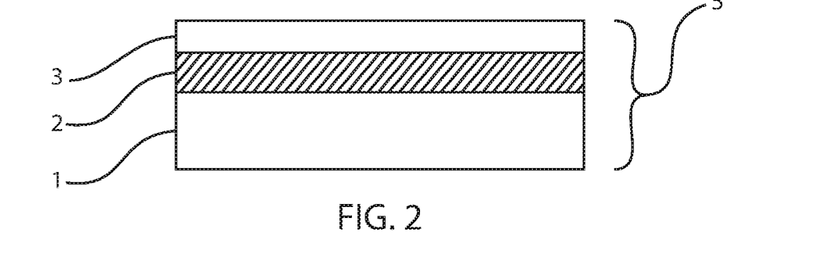
FIG. 2 is a side cross-sectional view of a substrate structure including a seed layer of first lattice dimension semiconductor material that is present on a dielectric layer, wherein the dielectric layer is present on a base substrate layer, in accordance with one embodiment of the present disclosure.

FIG. 2 depicts one embodiment of a semiconductor substrate 5 as used in one embodiment of the present disclosure. In one embodiment, the semiconductor substrate 5 is a semiconductor on insulator (SOI) substrate that includes a base semiconductor substrate 1 and a semiconductor on insulator (SOI) layer 3 that are electrically isolated from each other by a dielectric layer 2.

The SOI layer 3 may hereafter interchangeably be referred to as a seed layer, which provides the site for the epitaxial deposition of a later described semiconductor layer as part of the super lattice structure. The SOI layer 3 is typically composed of a first semiconductor material having a first lattice dimension. For example, the SOI layer 3 may be composed of silicon, silicon doped with carbon (Si:C) or germanium. The SOI layer 3 may be composed of a crystalline semiconductor, such as a semiconductor having a single crystalline crystal structure, a polycrystalline crystal structure or a multicrystalline crystal structure. The term "single crystalline" denotes a crystalline solid in which the crystal lattice of the entire material is substantially continuous and substantially unbroken to the edges of the material, with substantially no grain boundaries. The terms "polycrystalline" and "multicrystalline" denote material solely containing crystalline grains separated by grain boundaries.

To provide the seed layer for the super lattice structure, the SOI layer 3 may be planarized, grinded or etched to a thickness of less than 40 nm. For example, the thickness of the SOI layer 3 may be thinned to a thickness ranging from 1 nm to 20 nm. In yet another example, the thickness of the SOI layer 3 may range from 2 nm to 10 nm. In an even further example, the thickness of the SOI layer 3 may range from 2 nm to 5 nm.

The dielectric layer 2 separating the SOI layer 3 and the base semiconductor substrate 1 may be a crystalline or non-crystalline oxide, nitride, oxynitride, or any other suitable insulating material. The thickness of the dielectric layer 2 may range from 10 nm to 300 nm.

The base substrate layer 1 may comprise at least one of Si, Ge alloys, SiGe, GaAs, InAs, InP, SiCGe, SiC as well as other III/V or II/VI compound semiconductors. The SOI layer 3 and base substrate layer 1 may comprise the same or different materials. The thickness of the base substrate layer 1 may range from 1000 nm to 1 mm. It is noted that the base substrate layer 1 does not necessary have to be a semiconductor. For example, the base substrate layer 1 may be composed of an insulator, such as glass.

Figure 3:
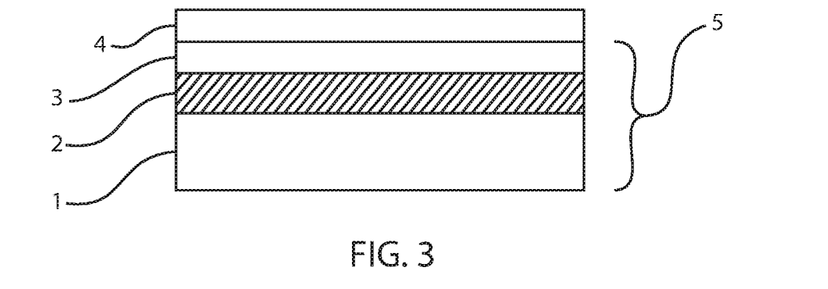
FIG. 3 is a side cross-sectional view of one embodiment of epitaxially forming a first layer of a second lattice dimension material on the seed layer, in accordance with one embodiment of the present disclosure.

FIG. 3 depicts one embodiment of epitaxially forming a first layer 4 of a second lattice dimension material having a thickness less than 40 nm on the seed layer of the first lattice dimension material, in which the seed layer is provided by the SOI layer 3. The terms "epitaxially forming" and "epitaxial deposition" mean the growth of a semiconductor material on a deposition surface of a semiconductor material, in which the semiconductor material being grown has the same crystalline characteristics as the semiconductor material of the deposition surface. For example, if the SOI layer 3 of the first lattice dimension material has a single crystalline crystal structure, the epitaxially formed first layer 4 of the second lattice dimension material will also have a single crystalline crystal structure. The term "epitaxial" as used to describe a material denotes that the material was formed using an epitaxial deposition process and has the same crystalline structure as the deposition surface on which the material was formed.

In some embodiments, the first layer 4 may be composed of silicon germanium (SiGe). In one example, the germanium content of the first layer 4 may range from 5% to 70%, by atomic weight %. In another embodiment, the germanium content of the epitaxial layer of silicon germanium may range from 10% to 40%. A number of different sources may be used for the deposition of epitaxial silicon germanium (SiGe). In some embodiments, the gas source for the deposition of epitaxial SiGe may include a mixture of silicon containing gas sources and germanium containing gas sources. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof.

In another embodiment, the first layer 4 of second lattice dimension material may be composed of germanium (Ge). A number of different sources may be used for the deposition of epitaxial germanium. In some embodiments, the germanium containing gas sources for epitaxial growth include germane ($GeH_4$), digermane ($Ge_2H_6$), halogermane, dichlorogermane, trichlorogermane, tetrachlorogermane and combinations thereof.

The first layer 4 of the second lattice dimension material may be deposited using a chemical vapor deposition apparatus. Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes suitable for deposition the first layer 4 include, but are not limited to, Atmospheric Pressure CVD (APCVD), Rapid Thermal CVD (RTCVD), Low Pressure CVD (LPCVD) and Plasma Enhanced CVD (PECVD), Metal-Organic CVD (MOCVD) and combinations thereof.

It is noted that the thickness of the first layer 4 of the second lattice dimension may be selected to avoid the formation of defects. For example, the first layer 4 may have a thickness of 40 nm or less. In some embodiments, the thickness of the first layer 4 may range from 1 nm to 30 nm. In other embodiments, the thickness of the first layer 4 may range from 2 nm to 20 nm. In even further embodiments, the thickness of the first layer 4 may range from 5 nm to 10 nm. It is noted that the above thicknesses for the first layer 4 are provided for illustrative purposes only and are not intended to limit the present disclosure. For example, the thickness of the first layer 4 of the second lattice dimension material may be any thickness so long as the defect density with in the epitaxially formed first layer 4 is no greater than $1 \times 10^6/cm^2$.

In some embodiments, the difference in the dimension between the first lattice dimension material of the seed layer, e.g., silicon of the SOI layer 3, and the second lattice dimension material of the first layer 4, e.g., silicon germanium, provides a strain. For example a silicon germanium layer has a larger lattice dimension than a silicon layer. Therefore, forming a silicon germanium layer on a silicon layer produces a compressive strain in the silicon germanium layer. The presence of a strain can reduce the energy band gap of the material.

Figure 4:
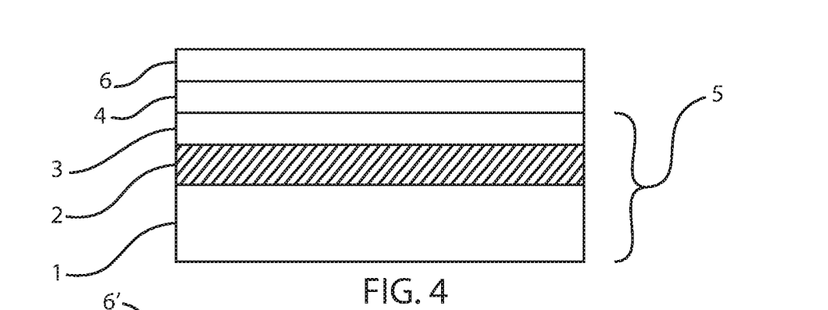
FIG. 4 is a side cross-sectional view depicting one embodiment of forming a second layer of a first lattice dimension material on the first layer of the second lattice dimension material, in accordance with one embodiment of the present disclosure.

FIG. 4 depicts one embodiment of forming a second layer 6 of the first lattice dimension material (e.g., having a same lattice dimension as the first lattice dimension material of the seed layer) on the first layer 4 of the second lattice dimension material. The second layer 6 may be formed using an epitaxial deposition process similar to the deposition process used to form the first layer 4. The second layer 6 may be formed using the same deposition apparatus, e.g., CVD apparatus, such as RTCVD, PECVD or MOCVD, as the apparatus used to form the first layer 4. The composition of the second layer 6 is selected to have a different lattice dimension than the first layer 4, so that a strain is produced in the epitaxially formed second layer 6. When the second layer 6 is composed of silicon (Si) and the first layer 4 is composed of silicon germanium (SiGe), a tensile strain may be present in the second layer 6.

For example, when the first layer 4 is silicon germanium (SiGe) and the second layer 6 is silicon (Si), in a continuous deposition process for the first and second layer 4, 6, the germanium precursor gas is turned off from the deposition process for the first layer 4 of SiGe, wherein the silicon gas precursor gas from the deposition process for the first layer 4 continues to the deposition process for the second layer 6 to provide a silicon source for the second layer 6. In this manner, the second material layer 6 can be deposited directly atop the first material layer 4 without removing the structure from the deposition apparatus. A number of different sources may be used for the deposition of epitaxial silicon. In some embodiments, the silicon containing gas sources for epitaxial growth include silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. The temperature for epitaxial silicon deposition typically ranges from 250° C. to 900° C. Although higher temperature typically results in faster deposition, the faster deposition may result in crystal defects and film cracking.

In another example, when the first layer 4 is composed of germanium and the second layer 6 is composed of silicon germanium (SiGe), to provide the second layer 6 of silicon germanium (SiGe), a silicon precursor gas for forming the second layer 6 is introduced to the germanium precursor gas flow for forming the first layer 4. In this manner, the second layer 6 can be deposited directly atop the first layer 4 without removing the structure from the deposition apparatus. A number of different sources may be used for the deposition of epitaxial silicon germanium. For example, an epitaxial layer of silicon germanium may be deposited from the combination of a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and a germanium gas source that is selected from the group consisting of germane, digermane, halogermane, dichlorogermane, trichlorogermane, tetrachlorogermane and combinations thereof.

Similar to the first layer 4, the second layer 6 may be deposited using a chemical vapor deposition apparatus, such APCVD, LPCVD, PECVD, RTCVD, MOCVD and combinations thereof. As indicated above, the deposition apparatus for forming the second layer 6 may be the same as the deposition apparatus for the first layer 4.

It is noted that the thickness of the second layer 6 of the first lattice dimension material may be selected to avoid the formation of defects. For example, the second layer 6 may have a thickness of 40 nm or less. In some embodiments, the thickness of the second layer 6 may range from 1 nm to 30 nm. In other embodiments, the thickness of the second layer 6 may range from 2 nm to 20 nm. In even further embodiments, the thickness of the second layer 6 may range from 5 nm to 10 nm. It is noted that the above thicknesses for the second layer 6 are provided for illustrative purposes only and are not intended to limit the present disclosure. For example, the thickness of the second layer 6 may be any thickness so long as the defect density within the epitaxially formed second layer 6 is no greater than $1 \times 10^6/\text{cm}^2$.

Figure 5:
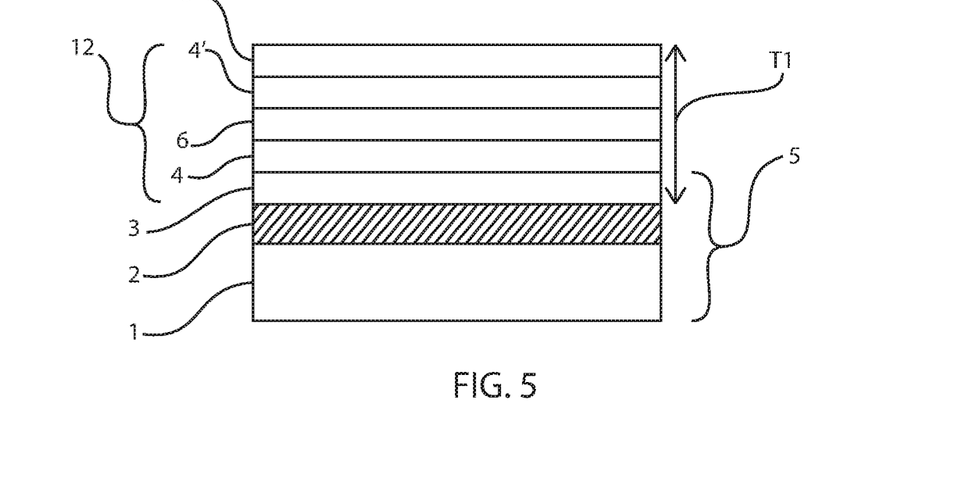
FIG. 5 is a side cross-sectional view depicting alternating epitaxial formation of the first lattice dimension material and the second lattice dimension material layer, in accordance with one embodiment of the present disclosure.

FIG. 5 depicts alternating epitaxial formation of the first layer 4' and the second layer 6'. By "alternating" it is meant that starting on the second layer 6 of the first lattice dimension material, epitaxial depositions of a first layer 4' of the second lattice dimension material and the second layer 6' of the first lattice dimension material may occur in a successive manner. The deposition sequence may end with either the formation of a first lattice dimension material or a second lattice dimension material. The combination of the SOI layer 3 (also referred to as seed layer), the first layer 4, the second layer 6, and the alternating sequence of the first and second layers 4', and 6' provide the super lattice structure 12. A portion of the super lattice structure 12 provides at least a base region, e.g., intrinsic base region, of the bipolar junction transistor (BJT).

In one embodiment, the first layer 4' of the alternating sequence of the first layer 4' and the second layer 6' is similar to the first layer 4 that is described above with reference to FIG. 3. Therefore, the above description of the first layer 4 that is depicted in FIG. 3 is suitable for the description of the first layer 4' of the alternating sequence of the first layer 4' and the second layer 6' that is depicted in FIG. 5. For example, the first layer 4' may be composed of epitaxially formed silicon germanium (SiGe) that has a thickness of 40 nm or less.

In one embodiment, the second layer 6' of the alternating sequence of the first layer 4' and the second layer 6' is similar to the second layer 6 that is described above with reference to FIG. 4. Therefore, the above description of the second layer 6 that is depicted in FIG. 4 is suitable for the description of the second layer 6' of the alternating sequence of the first layer 4' and the second layer 6' that is depicted in FIG. 5. For example, the second layer 6' of the alternating sequence of the first layer 4' and the second layer 6' may be composed of epitaxially formed silicon (Si) that has a thickness of 40 nm or less.

Referring to FIG. 5, the super lattice structure 12 of the SOI layer 3 (also referred to as seed layer), the first layer 4, the second layer 6, and the alternating sequence of the first and second layers 4', 6' may be composed of any number of layers. The thickness T1 of the super lattice structure 12 may range from 100 nm to 1 micron, as measured from the upper surface of the dielectric layer 2. In some embodiments, the thickness T1 of the super lattice structure may range from 100 nm to 500 nm, as measured from the upper surface of the dielectric layer 2. In yet other embodiments, the thickness T1 of the super lattice structure 12 may range from 150 nm to 350 nm.

In some embodiments, the layers of the super lattice structure 12, i.e., SOI layer 3 (also referred to as seed layer), the first material layer 4, the second material layer 6, and the alternating sequence of the first and second material layer 4', 6', may be doped to a p-type or n-type conductivity type. As used herein, the term "conductivity type" denotes a dopant region being p-type or n-type. As used herein, "p-type" refers to the addition of impurities to an intrinsic semiconductor that creates deficiencies of valence electrons. In a type IV semiconductor material, such as the silicon and silicon germanium materials used for the first layer 4, 4' and the second layer 6, 6', examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, examples of n-type dopants, i.e., impurities, include but are not limited to antimony, arsenic and phosphorous. The dopant for the first layer 4, 4' and the second layer 6, 6' may dictate the conductivity type of the base region, i.e., intrinsic base region, of the lateral bipolar junction transistor. The dopant may be introduced to the first layer 4, 4' and the second layer 6, 6 in-situ or my employing ion implantation. By "in-situ" it is meant that the dopant that dictates the conductivity type of the super lattice structure 12 is introduced during the process step, e.g., epitaxial deposition, that forms the first layer 4, 4' and the second layer 6, 6'. For in-situ doping, typical precursors used are diborane ($B_2H_6$), phosphine ($PH_3$) and arsine ($AsH_3$). The dopant concentration of the n-type or p-type dopant in the super lattice structure 12 may range from $1 \times 10^{15}$ atoms/cm$^3$ to $5 \times 10^{19}$ atoms/cm$^3$. In another embodiment, the dopant concentration of the n-type or p-type dopant in the super lattice structure 12 may range from $1 \times 10^{17}$ atoms/cm$^3$ to $5 \times 10^{18}$ atoms/cm$^3$.

Figure 6:
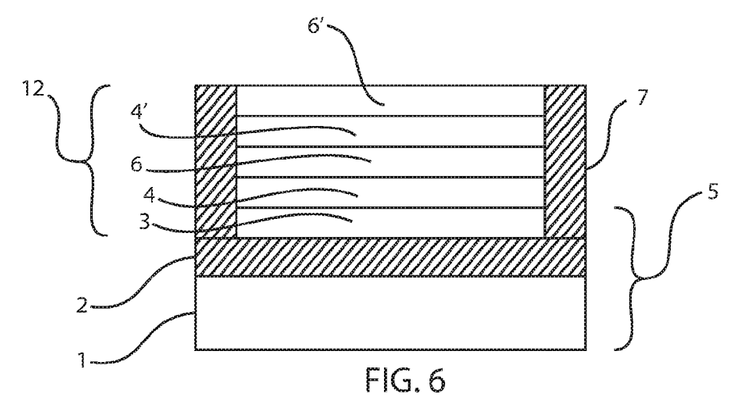
FIG. 6 is a side cross-sectional view depicting forming isolation regions, in accordance with one embodiment of the present disclosure.

FIG. 6 depict one embodiment of forming isolation regions 7 through end portion of the super lattice structure, wherein the portion of super lattice structure 12 that is present between the isolation regions will contain the base region and the later formed emitter and collector regions for the lateral bipolar junction transistor (BJT). In some embodiments, the isolation regions 7 may be shallow trench isolation (STI) region. The STI regions may be formed by etching a trench through the super lattice structure 12 extending to the dielectric layer 2, and then filling the trench with a dielectric material, such as an oxide, nitride or oxynitride material. The trench may be filled with dielectric material using a deposition process, such as chemical vapor deposition. Following deposition, a planarization process, such as chemical mechanical planarization, may be applied to the upper surface of the dielectric material of the isolation region 7, so that the upper surface of the isolation region is coplanar with the upper surface of the super lattice structure 12.

Figure 7:
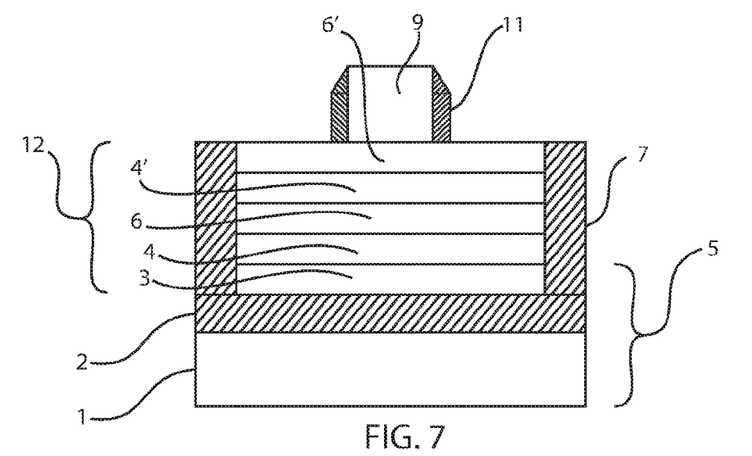
FIG. 7 is a side cross-sectional view depicting forming an extrinsic semiconductor region to a base region portion of the layered stack of first and second lattice dimension materials, in accordance with one embodiment of the present disclosure.

FIG. 7 depicts one embodiment of forming an extrinsic semiconductor region 9 (also referred to as extrinsic base region) to a base region portion of the super lattice structure 12. The extrinsic semiconductor region 9 may be formed of any semiconductor material. In one example, the extrinsic semiconductor region 9 is composed of a hydrogenated silicon containing material. In another example, the extrinsic semiconductor region 9 may be composed of silicon. The extrinsic semiconductor region 9 may have a single crystal crystalline structure or a multicrystalline crystal structure. The extrinsic semiconductor region 9 may also have an amorphous, nano-crystalline, micro-crystalline or poly-crystalline structure. The extrinsic semiconductor region 9 may be composed of any of the semiconductor materials that have been described above for the composition of the first layer 4, 4' and the second layer 6, 6'. The extrinsic semiconductor region 9, which is hereafter referred to as extrinsic base region 9, has the same conductivity type, i.e., p-type or n-type conductivity, as the intrinsic base region portion of the super lattice structure. The concentration of the dopant that provides the conductivity type of the extrinsic base region 9 is typically, but not necessarily, greater than the concentration of the dopant that provides the conductivity type of the intrinsic base region portion of the super lattice structure. For example, when the extrinsic base region 9 has an n-type conductivity, the concentration of the n-type dopant may range from $10^{18}$ atoms/cm$^3$ to $10^{21}$ atoms/cm$^3$ although higher and lower concentrations are also possible. For example, when the extrinsic base region 9 has a p-type conductivity, the concentration of the p-type dopant may range from $10^{18}$ atoms/cm$^3$ to $10^{21}$ atoms/cm$^3$ although higher and lower concentrations are also possible.

The extrinsic base region 9 may be formed by forming a material layer, e.g., epitaxially forming, on the upper surface of the super lattice structure 12 using a deposition process, such as chemical vapor deposition. Following deposition, the material layer may be patterned and etched to define the extrinsic base region 9. The dopant that dictates the conductivity type of the extrinsic base region 9 may be introduced in situ or by ion implantation. The conductivity type of the extrinsic base region 9 is typically the same as the conductivity of the intrinsic base region.

In some embodiments, a dielectric spacer 11 may be formed on opposing sides of the extrinsic base region 9. The dielectric spacer 11 may be composed of any dielectric, such as an oxide, nitride or oxynitride material, and may be formed using deposition and etch processes.

Figure 8:
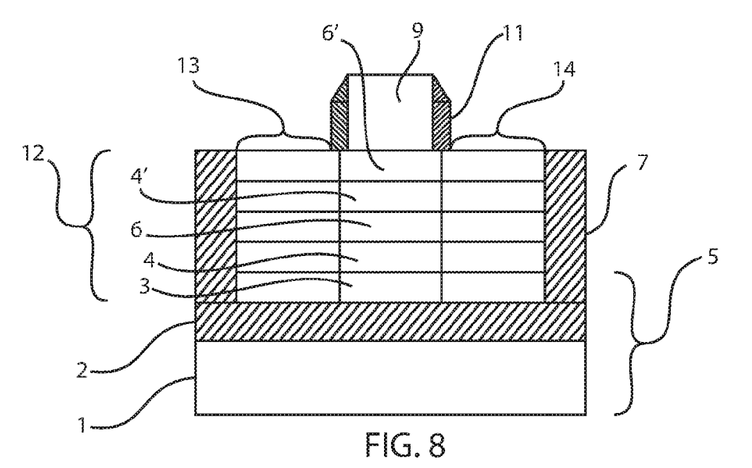
FIG. 8 is a side cross-sectional view depicting forming an emitter region and a collector region on opposing sides of the base region portion depicted in FIG. 7 by ion implantation, in accordance with one embodiment of the present disclosure.

FIG. 8 depicts forming an emitter region 13 and a collector region 14 on opposing sides of the intrinsic base region portion of the super lattice structure 12 depicted in FIG. 7 by ion implantation. For example, when the lateral bipolar junction transistor being formed is a PNP transistor, and the base region portion of the super lattice structure 12 is doped to an n-type conductivity, the emitter region 13 and the collector region 14 may be formed by ion implanting a p-type dopant into the exposed portions of the super lattice structure 12 that are present on opposing sides of the extrinsic base region 9. The dopant concentration of the p-type dopant in the emitter region 13 and the collector region 14 may range from $10^{18}$ atoms/cm$^3$ to $10^{21}$ atoms/cm$^3$. In another embodiment, the dopant concentration of the p-type dopant in the emitter region 13 and the collector region 14 may range from $10^{19}$ atoms/cm$^3$ to $10^{20}$ atoms/cm$^3$. In another example, when the lateral bipolar junction transistor being formed is an NPN transistor, and the base region portion of the super lattice structure 12 is doped to a p-type conductivity, the emitter region 13 and the collector region 14 may be formed by ion implanting an n-type dopant into the exposed portions of the super lattice structure that are present on opposing sides of the extrinsic base region 9. The dopant concentration of the n-type dopant in the emitter region 13 and the collector region 14 may range from $10^{18}$ atoms/cm$^3$ to $10^{21}$ atoms/cm$^3$. In another embodiment, the dopant concentration of the n-type dopant in the emitter region 13 and the collector region 14 may range from $10^{19}$ atoms/cm$^3$ to $10^{20}$ atoms/cm$^3$.

Figure 9:
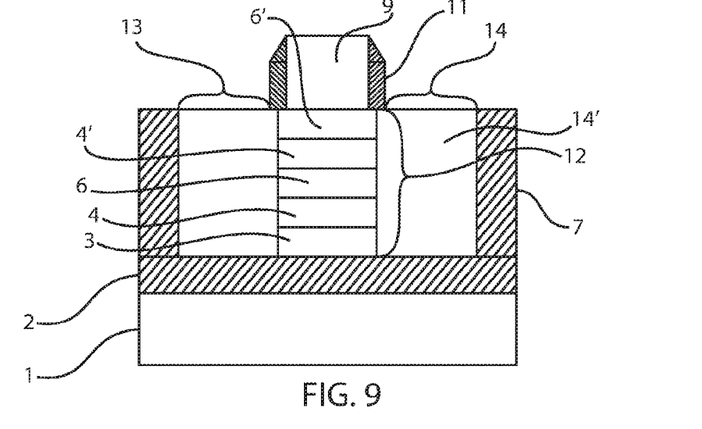
FIG. 9 is a side cross-sectional view depicting forming an emitter region and a collector region on opposing sides of the base region by employing an etch process to form a trench and filling the trench with the emitter and collector region material, in accordance with another embodiment of the present disclosure.

FIG. 9 depicts another embodiment of forming an emitter region 13' and a collector region 14' on opposing sides of the base region of the super lattice structure 12 by employing an etch process to form a trench and filling the trench with the emitter and collector region material. In some embodiments, the exposed portions of the super lattice structure 12 on opposing sides of the extrinsic base region 9 may be removed by an anisotropic etch process, such as reactive ion etch. The etch process for removing the material of the super lattice structure 12 may be selective to the isolation regions 7 and the extrinsic base region 9. In some embodiments, etch masks, such as photoresist masks, may be employed to protect the portions of the structure while forming the trenches in the emitter and collector regions. Following formation of the trenches in the emitter and collector regions, a semiconductor material may be deposited within the trenches to provide the base material for the emitter region 13' and the collector region 14'. The semiconductor material may be selected from elemental semiconductor materials (e.g., silicon, germanium, silicon germanium, or alloys thereof), III-V semiconductor materials, or II-VI semiconductor materials. The deposition process for forming the semiconductor material may be chemical vapor deposition, plasma enhanced chemical vapor deposition, metal organic chemical vapor deposition, chemical solution deposition, physical vapor deposition and spin on deposition. The material for the emitter region 13' and the collector region 14' may be doped with an n-type or p-type dopant in situ or by using ion implantation. The dopant type and concentration for the emitter region 13' and the collector region 14' that are depicted in FIG. 9, are similar to the emitter region 13 and the collector region 14 that are depicted in FIG. 8.

Figure 10:
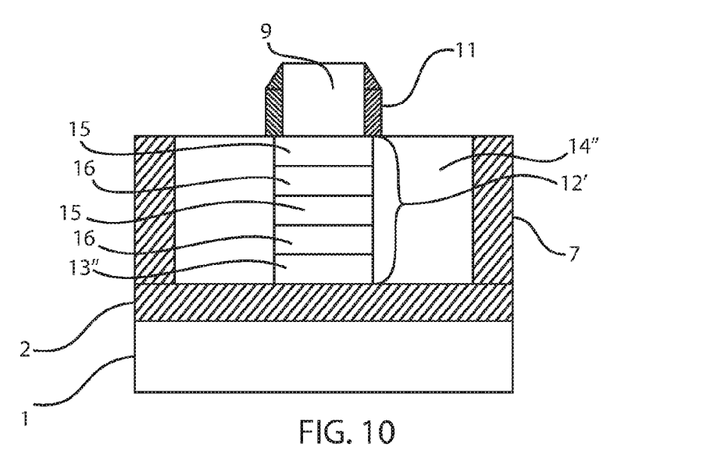
FIG. 10 is a side cross-sectional view depicting a lateral bipolar junction transistor including at least a base region of a III-V semiconductor containing super lattice structure, wherein the base region is present on a dielectric layer, in accordance with one embodiment of the present disclosure.

FIG. 10 depicts another embodiment of the present disclosure. In the embodiment that is depicted in FIG. 10, the lateral bipolar junction transistor is similar to the lateral bipolar junction transistor that is depicted in FIG. 8 with the exception that the super lattice structure 12' is composed of alternating III-V semiconductor material layers. A lateral bipolar transistor including a super lattice structure 12' composed of III-V semiconductor materials may be suitable for high voltage/high power applications, in which semiconductor materials having a greater energy band gap than type IV semiconductors, such as silicon and germanium, may be preferred.

A "III-V semiconductor material" is an alloy composed of elements from group III and group V of the periodic table of elements. In one embodiment, the super lattice structure 12' depicted in FIG. 10 includes two alternating layers of III-V semiconductor materials 15, 16. The composition of the two alternating layers of III-V semiconductor materials 15, 16 is selected to provide a super lattice structure 12'. For example, the two alternating layers of III-V semiconductor materials 15, 16 may be selected from the group consisting of aluminum antimonide (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide ($In_xGa_{1-x}As$), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. As known in the art, the superlattice structures may or may not be strained. Typically, lattice matched layers result in unstrained superlattice structures while lattice mismatch results in strained superlattic structures.

Each of the III-V semiconductor materials 15, 16 that provide the super lattice structure 12' may have a single crystal, multi-crystal or polycrystalline crystal structure. Each of the III-V semiconductor materials may be epitaxially deposited material layers. A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), tertiary-butylphosphine (TBP), phosphine ($PH_3$), ammonia ($NH_3$), and combinations thereof. In some embodiments, the III-V materials are grown from solid sources using molecular beam epitaxy (MBE) at temperatures close to room temperature. In some embodiments, the III-V materials are grown using plasma-assisted MBE, where plasma is used to crack precursor gases such as $NH_3$ or $PH_3$ to provide N or P atoms, in conjunction with the MBE from solid sources. In some embodiments a metalorganic chemical vapor deposition (MOCVD) process is used wherein the temperature for epitaxial deposition of type III-V semiconductor materials typically ranges from 250° C. to 900° C. Although higher temperature typically results in faster deposition, the faster deposition may result in crystal defects and film cracking.

Each of the III-V semiconductor material layers 15, 16 may have a thickness ranging of 40 nm or less. In some embodiments, the thickness for each of the III-V semiconductor material layers 15, 16 may range from 1 nm to 30 nm. In other embodiments, the thickness for each of the III-V semiconductor material layers 15, 16 range from 2 nm to 20 nm. In even further embodiments, the thickness for each of the III-V semiconductor material layers may range from 5 nm to 10 nm. It is noted that the above thicknesses for each of the III-V semiconductor material layers 15, 16 are provided for illustrative purposes only and are not intended to limit the present disclosure. For example, the thickness for each of the III-V semiconductor material layers 15, 16 may be any thickness so long as the defect density with in the epitaxially formed III-V semiconductor material layers 15, 16 is preferably not greater than $1 \times 10^6/cm^2$.

To provide the n-type and p-type regions for the emitter region 13", base region (i.e., intrinsic base region) and collector region 14", the super lattice structure 12' of the III-V semiconductor materials may be doped. The base region of the super lattice structure 12' is typically doped using in situ doping, and the emitter region 13" and the collector region 14" may be doped using ion implantation. The effect of the dopant atom, i.e., whether it is a p-type or n-type dopant, depends on the site occupied by the dopant atom on the lattice of the base material. In a III-V semiconductor, atoms from group II act as acceptors, i.e., p-type, when occupying the site of a group III atom, while atoms in group VI act as donors, i.e., n-type, when they replace atoms from group V. Dopant atoms from group IV, such as silicon (Si), have the property that they can act as donors or acceptors depending on whether they occupy the site of group III or group V atoms respectively. Such impurities are known as amphoteric impurities.

The lateral bipolar junction transistor depicted in FIG. 10 is similar to the lateral bipolar junction transistor that is depicted in FIG. 8. Therefore, the description of the base substrate layer 1, the dielectric layer 2, the extrinsic base region 9 and the sidewall spacers 11 that are depicted in FIG. 8 is suitable for the description of the base substrate layer 1, the dielectric layer 2, the extrinsic base region 9 and the sidewall spacers 11 that are depicted in FIG. 10. In some embodiments, a semiconductor on insulator (SOI) layer of a silicon containing material, such as silicon (Si), may be present between the super lattice structure 12' and the dielectric layer 2.

Figure 11:
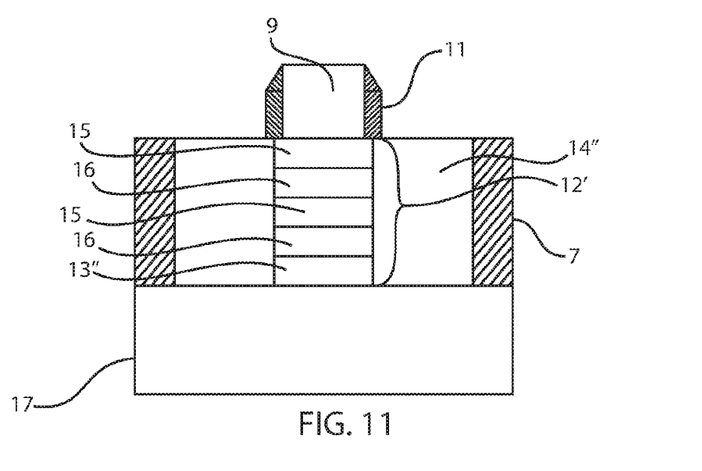
FIG. 11 is a side cross-sectional view depicting a lateral bipolar junction transistor including at least a base region of a III-V semiconductor containing super lattice structure, wherein the base region is present on a semi-insulating substrate, in accordance with one embodiment of the present disclosure.

FIG. 11 depicts another embodiment of a lateral bipolar junction transistor. In the embodiment that is depicted in FIG. 11, the super lattice structure 12' is present on a semi-insulating substrate 17. The semi insulating substrate 17 may be composed of gallium arsenide (GaAs) that is doped with chromium (Cr) or oxygen (O). The description of the super lattice structure 12', the isolation regions 7 and the extrinsic semiconductor region 9 that are depicted in FIG. 10 are suitable for the super lattice structure 12', the isolation regions 7 and the extrinsic semiconductor region 9 that are depicted in FIG. 11.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A lateral transistor comprising:
    a base region of a layered stack of alternating material layers that repeat at least once of a first lattice dimension material and a second lattice dimension material to provide a strained base region; and
    a collector region and emitter region on opposing sides of the base region.

2. The lateral transistor of claim 1, wherein the first lattice dimension material is silicon and the second lattice dimension material is silicon germanium.

3. The lateral transistor of claim 1, wherein each of the alternating material layers have a thickness of 40 nm or less.

4. The lateral transistor of claim 1, wherein the first lattice dimension material is a first III-V semiconductor material and the second lattice dimension material is a second III-V semiconductor material.

5. The lateral transistor of claim 1, wherein the base region has a thickness greater than 500 nm.

6. The lateral transistor of claim 1 further comprising an extrinsic semiconductor region to the base region, wherein the base region provides an intrinsic base region of the lateral bipolar junction transistor, and the extrinsic semiconductor region provides an extrinsic base region of the lateral bipolar junction transistor.

7. The lateral transistor of claim 1, wherein the lateral bipolar junction transistor is an NPN transistor.

8. The lateral transistor of claim 1, wherein the lateral bipolar junction transistor is a PNP transistor.

9. The lateral transistor of claim 4, wherein the dielectric substrate layer is a semi-insulating substrate.

10. The lateral transistor of claim 1, wherein the base region, emitter region and collector region are present on a dielectric substrate.

11. The lateral transistor of claim 1, wherein the lateral transistor is a bipolar junction transistor.

12. A lateral transistor comprising:
- a base region including a layered stack of alternating silicon and germanium layers that repeat at least once, wherein each layer of the layered stack has a thickness no greater than 40 nm; and
- a collector region and emitter region on opposing sides of the base region.

13. The lateral transistor of claim 12, wherein the layered stack has a total thickness that is greater than 60 nm.

14. The lateral transistor of claim 12, wherein the base region has a thickness greater than 500 nm.

15. The lateral transistor of claim 12, wherein the lateral bipolar transistor is an NPN transistor.

16. The lateral transistor of claim 12 wherein the lateral bipolar transistor is a PNP transistor.

17. The lateral transistor of claim 12, wherein the base region, emitter region and collector region are present on a dielectric substrate.

18. The lateral transistor of claim 12, wherein the lateral transistor is a bipolar junction transistor.

* * * * *